United States Patent
Alteneiji

(10) Patent No.: US 11,545,591 B2
(45) Date of Patent: Jan. 3, 2023

(54) LIGHT TRAPPING DYNAMIC PHOTOVOLTAIC MODULE

(71) Applicant: Hamad Musabeh Ahmed Saif Alteneiji, Sharjah (AE)

(72) Inventor: Hamad Musabeh Ahmed Saif Alteneiji, Sharjah (AE)

( * ) Notice: Subject to any disclaimer, the term of this patent is extended or adjusted under 35 U.S.C. 154(b) by 177 days.

(21) Appl. No.: 17/094,231

(22) Filed: Nov. 10, 2020

(65) Prior Publication Data

US 2021/0184063 A1    Jun. 17, 2021

(51) Int. Cl.
| | | |
|---|---|---|
| *H01L 31/054* | (2014.01) | |
| *H01L 31/0443* | (2014.01) | |
| *H01L 31/05* | (2014.01) | |
| *H01L 31/048* | (2014.01) | |
| *H01L 31/18* | (2006.01) | |

(52) U.S. Cl.
CPC ........ *H01L 31/0547* (2014.12); *H01L 31/048* (2013.01); *H01L 31/0443* (2014.12); *H01L 31/0504* (2013.01); *H01L 31/18* (2013.01)

(58) Field of Classification Search
CPC ............... H01L 31/0201; H01L 31/044; H01L 31/0443; H01L 31/048; H01L 31/049; H01L 31/0504; H01L 31/0547; H01L 31/18
See application file for complete search history.

(56) References Cited

U.S. PATENT DOCUMENTS

| | | | | |
|---|---|---|---|---|
| 6,323,415 | B1* | 11/2001 | Uematsu ........... | B32B 17/10018 136/246 |
| 2014/0116495 | A1* | 5/2014 | Kim ................... | H02S 40/22 136/246 |
| 2015/0059831 | A1* | 3/2015 | Fukumochi ......... | H01L 31/048 136/246 |
| 2016/0087132 | A1* | 3/2016 | Alteneiji ........... | H01L 31/035281 136/244 |
| 2018/0366606 | A1* | 12/2018 | Murakami ......... | H01L 31/0547 |
| 2019/0035963 | A1* | 1/2019 | Maekawa ........... | H01L 31/049 |
| 2019/0296172 | A1* | 9/2019 | Kang ................. | H01L 31/0508 |
| 2019/0319579 | A1* | 10/2019 | Shugar .............. | H02S 40/22 |

\* cited by examiner

*Primary Examiner* — Mayla Gonzalez Ramos
(74) *Attorney, Agent, or Firm* — Hayes Soloway P.C.

(57) ABSTRACT

There is provided a light trapping dynamic photovoltaic module having a module surface configured to be exposed to solar rays, including a plurality of photovoltaic cell stacks configured adjacent to each other throughout the module surface, wherein each photovoltaic cell stack comprises a plurality of photovoltaic cells. Further, a plurality of reflective strips are placed in between each of the photovoltaic cell stacks for continuously reflecting incident solar rays from one reflective strip to another until absorbed by a photovoltaic cell among said plurality of photovoltaic cells, wherein the incident solar rays are continuously reflected through a mirror phenomenon, wherein the incident solar rays are additionally reflected by front and back panels of the dynamic photovoltaic module, thereby trapping incident solar rays within boundaries of the dynamic photovoltaic module for conversion into electrical energy. Also disclosed is a method of manufacturing the light trapping photovoltaic module.

13 Claims, 18 Drawing Sheets

LIGHT TRAPPING DYNAMIC PHOTOVOLTAIC MODULE

CROSS-REFERENCE TO RELATED APPLICATIONS AND PRIORITY

This patent application claims priority from United Arab Emirates Patent Application No. P6001766/2019 filed Dec. 12, 2019. This patent application is herein incorporated by reference in its entirety.

FIELD OF THE INVENTION

The present invention relates to a dynamic photovoltaic (PV) module, and more particularly to a light trapping PV module.

BACKGROUND OF THE INVENTION

Background description includes information that may be useful in understanding the present invention. It is not an admission that any of the information provided herein is prior art or relevant to the presently claimed invention, or that any publication specifically or implicitly referenced is prior art.

Photovoltaic (PV) modules constitute the photovoltaic array of a photovoltaic system that generates and supplies solar electricity in commercial and residential applications. A PV module consists of a number of interconnected and encapsulated solar cells. A bulk silicon PV module consists of multiple individual solar cells connected, nearly always in series, to increase the power and voltage. While the voltage from the PV module is determined by the number of solar cells, the current from the module depends primarily on the size of the solar cells and also on their efficiency.

Mismatch losses are a serious problem in PV modules and arrays. Mismatch losses are caused by the interconnection of solar cells or modules which do not have identical properties or which experience different conditions from one another like illumination and temperature. As most PV modules are series-connected, series mismatches are the most common type of mismatch encountered. Overall, in a series connected configuration with current mismatch, severe power reductions are experienced if the poor cell produces less current than the maximum power current of the good cells and also if the combination is operated at short circuit or low voltages, the high power dissipation in the poor cell can cause irreversible damage to the module.

One common source of current mismatch in a PV module is shading. Shading is a problem in PV modules since shading just one cell in the module can reduce the power output to zero. The high power of good cells will dissipate in the shaded cell that can cause irreversible damage to the PV module due to high temperature. The output of a cell declines when shaded by a tree branch, building or module dust. The output declines proportionally to the amount of shading since cells in a module are all connected in series. Therefore, shading a single cell causes the current in the string of cells to fall to the level of the shaded cell. The case is also reflected on all PV modules that are connected in series in the same string.

In conventional systems equipped with string inverters where the MPP-Tracking is performed on a string basis, some modules operate below their maximum power point due to differences in module tolerances and lighting conditions. At a scale of PV array, the PV curve of the entire array exists as the series sum of the modules and the parallel sum of the strings. A shadow moving over the surface of several modules over time has the effect of constantly changing the PV curve from one smooth peak to more of a mountain range. As the peaks of the PV curve in the inverter change from the shade, the electronics that track the maximum power point can become confused or lost, causing the inverter to choose to operate for long periods well outside the optimal output range. This can cause significant loss of power output and eventually annual energy yield.

Many modern panels, however, come equipped with devices called bypass diodes which minimize the effects of partially shaded PV panel by essentially enabling electricity to 'flow around' the shaded cell or cells. This bypass solution will protect the panel from forming hot-spots, however the power of good cells covered by same bypass diode will be lost and voltage contribution will be deducted from the overall system voltage that might force solar inverter to switch off in case the received voltage is less than start up voltage.

Accordingly, there exists a need for a dynamic PV module which can compensate for the possible losses and result in an equal or greater amount of power output, but with a comparatively reduced number of PV cells.

SUMMARY OF THE INVENTION

Therefore it is an object of the present invention to develop a dynamic PV module which compensates for the possible losses and results in an equal or greater amount of power output, but with a comparatively reduced number of PV cells.

The present invention involves a light trapping dynamic photovoltaic module having a module surface configured to be exposed to solar rays, comprising a plurality of photovoltaic cell stacks configured adjacent to each other throughout the module surface, wherein each photovoltaic cell stack among said plurality of photovoltaic cell stacks comprises a plurality of photovoltaic cells; and a plurality of reflective strips placed in between each of the photovoltaic cell stacks for continuously reflecting incident solar rays from one reflective strip to another until absorbed by a photovoltaic cell among said plurality of photovoltaic cells, wherein the incident solar rays are continuously reflected through a mirror phenomenon, wherein the incident solar rays are additionally reflected by front and back panels of the dynamic photovoltaic module, thereby trapping incident solar rays within boundaries of the dynamic photovoltaic module for conversion into electrical energy.

In another embodiment, the plurality of reflective strips are light stimulating or light harvesting reflective strips.

In another embodiment, the light harvesting reflective strips are made of a conductive material.

In another embodiment, the plurality of reflective strips are in contact with ribbons or bus-bars located in between each of the photovoltaic cell stacks, thereby creating parallel connections between the plurality of photovoltaic cells within each of the plurality of photovoltaic cell stacks.

In another embodiment, the plurality of photovoltaic cell stacks are connected in series to each other.

In another embodiment, the plurality of reflective strips are structured with a plurality of grooves along its width for reflecting the incident solar rays.

In another embodiment, the plurality of photovoltaic cell stacks are encapsulated in between a front and a back panel.

In another embodiment, two or more sets of the plurality of photovoltaic cell stacks are encapsulated in between a front and a back panel.

In another embodiment, the front panel is made of glass.

In another embodiment, the back panel is made of glass, a multi-layer laminate film or an ethylene vinyl acetate (EVA) film.

In another embodiment, the incident solar rays are reflected at an angle of 60° from the front panel of the light trapping photovoltaic module.

In another embodiment, bypass diodes are connected in parallel to the plurality of photovoltaic cell stacks for protection of the light trapping dynamic photovoltaic module.

As another aspect of the present invention is disclosed a method of manufacturing a light trapping photovoltaic module having a module surface configured to be exposed to solar rays, the method comprising the steps of placing a plurality of reflector strips in parallel with a plurality of photovoltaic cell stacks throughout the module surface; and encapsulating the plurality of photovoltaic cell stacks in between a front and a back panel, wherein each photovoltaic cell stack among said plurality of photovoltaic cell stacks comprises a plurality of photovoltaic cells; wherein the plurality of reflective strips placed in between each of the photovoltaic cell stacks enable continuous bouncing of incident solar rays from one reflective strip to another until absorbed by a photovoltaic cell among said plurality of photovoltaic cells, wherein the incident solar rays are additionally reflected by front and back panels of the dynamic photovoltaic module, thereby trapping incident solar rays within boundaries of the dynamic photovoltaic module for conversion into electrical energy.

BRIEF DESCRIPTION OF THE DRAWINGS

The subject matter that is regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION OF THE INVENTION

Figure 1:
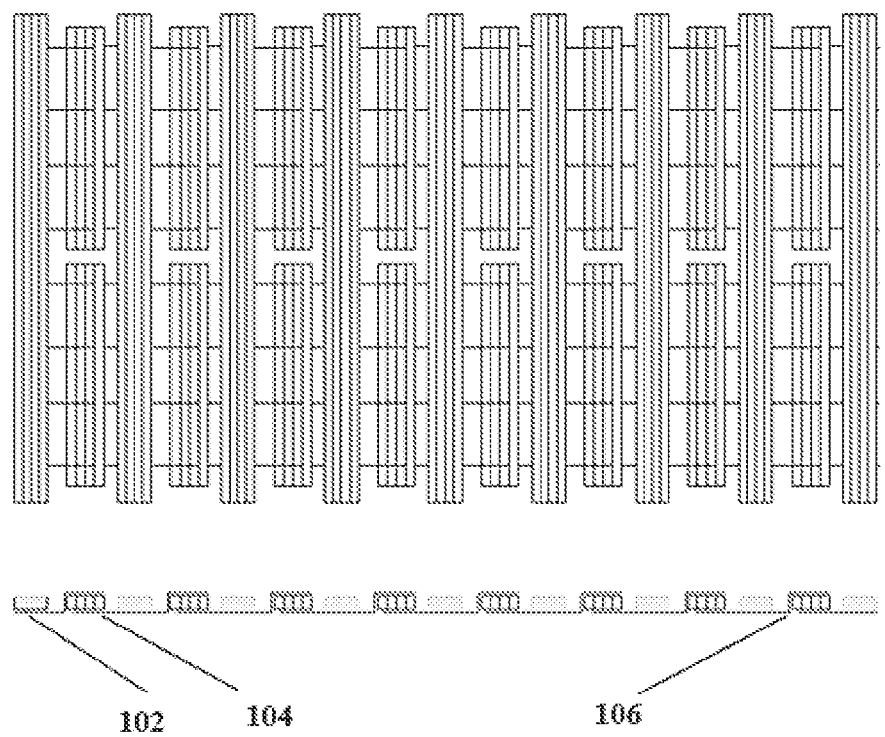
FIG. 1 shows a top view of the light trapping PV module in accordance with the present invention.

The aspects of the device or system for a dynamic PV module, which compensates for the possible losses and results in an equal or greater amount of power output according to the present invention will be described in conjunction with FIGS. 1-7. In the Detailed Description, reference is made to the accompanying figures, which form a part hereof, and in which is shown by way of illustration specific embodiments in which the invention may be practiced. It is to be understood that other embodiments may be utilized and logical changes may be made without departing from the scope of the present invention. The following detailed description, therefore, is not to be taken in a limiting sense, and the scope of the present invention is defined by the appended claims.

The proposed solution aims at overcoming traditional technical challenges affecting the performance of photovoltaic (PV) modules and adding an economical solution to previously employed PV modules. A solar cell, irrespective of the size, is cut into a plurality of equal sizes called sub-cells which are connected together in parallel as stacks called cell stacks. Balancing bus-bars are included connecting the sub-cells in order to maintain a same voltage across all the sub-cells within the stack. The cell stacks have the same electrical characteristics of an original solar cell but are different in its physical dimensions. The cell stacks are then connected in series, as a straight line. These cell stacks are encapsulated between glass to glass or glass to back sheet (or multi-layer laminate) with an ethylene vinyl acetate (EVA) film, in order to form the PV module. Terminals of the PV module are connected to a junction box.

This configuration will create the dynamicity feature for the PV module to enable its dynamic response at abnormal condition. The proposed PV module can manage all sources creating current mismatch problem hence enabling PV module current to flow without current mismatch, up to a large extent, and without the aid of any smart device.

In another embodiment of the present invention, bypass diodes are added for increased protection of the PV module. Additional parallel bypass diodes may also be added for protection redundancy.

The dynamic PV module proposed in the present invention comprises a series-parallel cell (sub-cells) interconnection, in order to create more paths for module current to pass through in case of any possible blocking at any point to avoid current mismatches, energy losses, power dissipation or hot spot formations. Several aspects to be taken into consideration while designing a dynamic PV module in accordance with this invention include power output, dependency ratio, module voltage and module current. Power output, dynamicity, module voltage and current depends on the size of the module, efficiency of the solar cells and number of sub-cells in the cell stack.

$$\text{Dependency Ratio} = (1/\text{Number of sub-cells in cell-stack}) * 100$$

The overall process of designing a dynamic PV module comprises choosing the type of solar cells, determining the dependency ratio, the sub-cell specification, the cell stack specification and the module surface area. Electrical and thermal characteristics of a used solar cell type make a major contribution to module electrical and thermal characteristics and in turn its performance. An original solar cell is cut, using laser or any other cutting technique, into symmetrical sub-cells in order to be used in the dynamic PV module. Dependency ratio is determined by defining the number of sub-cells per cell stack. Higher the sub-cell number per cell stack, lower will be the cell to cell dependency ratio and higher the dynamicity.

The sub-cell specifications, the number of sub-cells from an original solar cell is defined based on the selected dependency ratio. For example, if dependency factor is ($1/6$=16.7%) then original solar cell 6"×6" will be laser cut into 6 sub-cells of size 6"×1" (i.e., strips of length 6" and width 1"). With respect to cell stack specification, sub-cells arranged vertically and connected in parallel between two balancing bus-bars form a cell stack. The cell stack length is obtained by multiplying the number of sub-cells by the sub-cell length. The cell-stack width is similar to the sub-cell width.

Module power is determined through multiplying the cell stack power (original solar cell power) by the number of cell-stacks in the module. Considering the module surface area, module length is equal to cell stack length plus borders, and the module width is equal to number of cell stacks in the module multiplied by cell stack width (including spacing in between cell stacks) plus borders width. Module voltage is obtained from the cell stack voltage (original solar cell voltage) multiplied by the number of series cell-stacks in the module, and module current is obtained from current of a sub-cell multiplied by the number of sub-cells per stack (parallel current summation).

In another embodiment of the present invention, a number of bypass diodes may be added in parallel to the cell stacks for extreme protection and improvement of dynamicity. The minimum number of bypass diodes is one per module, however preferably may go up to one per each cell-stack. This would however affect the production costs, and hence, an optimum number of bypass diodes are chosen to cover a group of series cell stacks together. Further, an additional lower number of bypass diodes may also be added in parallel to the proposed main bypass diodes in order to add redundant protection.

Spacing tolerance is also considered while specifying dimensions. The overall electrical characteristics of the module (I-V curve) is expected to look like the original solar cell characteristic in shape. At testing under standard test conditions, an improvement in power components like current and voltage is observed to be obtained over the traditional cell string connections, owing to the proposed cell architecture connection. DC power value is the product of DC voltage by DC current ($P = V \times I$). The value of DC power can stay the same while the values of its components DC voltage and DC current can vary but both in opposite directions of each other (increasing and decreasing). With respect to the same PV module surface area, power output and dynamicity factor, the two power components voltage V and current I may be changed or adjusted at the design stage. Traditionally, on occurrence of a need to increase voltage and reduce current in order to suit the voltage range of solar inverter or to match the voltage of inverter peak efficiency, the solution was to use a 5"×5" cells instead of 6"×6" cells to increase the number of solar cells per module and in turn increase the summation of cells voltage in series that produce the module voltage.

However, the dynamic PV module according to this invention enables the feature of increasing voltage and decreasing current or vice versa, with respect to the same module surface area and out power, at the design stage itself, in order to allow the module specifications to suit different usage applications and project locations. For example, to take account of the impact of the environmental temperature and light radiance on the module voltage and current. A high environmental temperature (resulting in a high module temperature) may result in a decrease in the module voltage and a high environmental light radiance (resulting in radiance exposure to the module) may result in an increase in the module current.

The proposed solution is based on changing the width of sub-cells with respect to the standard width used in a standard Dynamic PV module. This in turn changes the cell-stack width and number of cell-stacks that may be accommodated in a module at a given surface area and power rating. Subsequently, a change in module voltage and current is possible. In other terms, the width of sub cells in cell stack and the number of cell stacks per module should be determined in order to adjust the module current and voltage taking into consideration the effect of the environmental conditions (mainly temperature and light radiance intensity) on these, for applications in specific region.

In an embodiment, in case the sub-cell width is increased beyond the standard width while its length is the same, then cell-stack width and area increase and it will be able to produce greater current, which represents the module current. At the same time, the number of cell stacks that can be accommodated within the given module area becomes smaller and therefore module voltage becomes lower. The overall power and module area will stay the same ($P = V \times I$). In contrast, in case sub-cell width is decreased below the standard width while its length is the same, then cell-stack width and area are decreased and it will produce less current, which represents the module current. At the same time, the number of cell stacks that may be accommodated within the given module area becomes greater and therefore module voltage becomes higher. In all these cases, the module area, power output and dynamicity will stay the same.

In another embodiment, a solar inverter is used to convert the output DC power generated from PV modules into an AC power form that suit the grid. In general, the proposed dynamic PV module helps a solar PV system to stabilize the input DC voltage to the solar inverter through mitigation of external impacts and to reduce DC voltage drop in side modules by reducing series resistances. An additional advantage includes that at the module designing stage, the proposed dynamic PV module design may be adjusted to generate DC power with a pre-specified voltage and current that suits certain applications and/or different project locations, thereby resulting in a module design voltage flexibility feature.

Considering that module current intensity is linearly proportional to the sun light intensity while the module voltage is not significantly impacted by the sun light intensity, although an increase in the module temperature may result in a slight increase in the module current, the module temperature increase can inversely affect the voltage of the module resulting in a reduction in voltage. Therefore, environmental light intensity and temperature may have an effect on the performance of PV modules. In other terms, a high light intensity expose would result in an increase of a current of the module and high temperature expose would result in a reduction of the voltage in the module.

In light of these considerations, the dynamic PV module design in accordance with the present invention is adjusted in order to take into consideration the temperature characteristics of the geographical region where the PV module is to be implemented in such a manner to compensate for the losses in current and/or voltage. In hot countries, the width of the sub-cells may be reduced in order to form a bigger number of cell stacks, which would result in an increase in the module voltage to compensate for the voltage loss that the raise in temperature would cause. In addition, in cold countries experiencing low radiations, the width of the sub-cells is increased in order to increase the current of the module that is determined by the current of the stack cell. In areas where sun light intensity and temperature are average or moderate, a standard module power specification may be used. In cold areas where the climate temperature is low and light intensity is lower than usual, the module will have a lower voltage and higher current with respect to the standard module design.

In another embodiment, the fact wherein a low module temperature will tend to increase module voltage and a low light intensity will reduce module current, will help to improve the performance of the module and make it fit more with the solar inverter input DC voltage range. In hot areas, like arid region, where the temperature is too high and sun light intensity is closer to higher limit, a proper module design involves designing a module with higher module voltage and lower module current with respect to the standard module design that has same surface area and rated output power. This design is because a high module temperature will tend to reduce module voltage and a high light intensity will increase module current.

In order to manage an increase in current and produce proper accumulated module voltage that will suit the inverter, the dynamic PV module in accordance with the present invention uses sub-cells with shorter widths in order to increase the number of cell stacks within the same module area and in turn increase the module voltage greater than standard. At the same time this will reduce module current lower than the standard, without any reduction in power ($P=V\times I$). This current reduction will also let the solar system has lower internal power loss and voltage drop, leading to the new module being more efficient and its voltage being more suitable for solar inverters.

Solar power concentrators are used to concentrate sun light onto smaller area of solar technology, and the concentration ratio is measured based on the number of suns concentrated on a solar receiver. Conventional solar cells can work with low sun concentration, few tens of suns. Under sun concentration, the power produced has very high current due to high sun light intensity, at standard or lower voltages, due to increase in temperature. In an embodiment, in order to design a PV module with higher voltage and low current at rated power, the voltage flexibility feature of the dynamic PV modules helps to adjust the power parameters (voltage and current) that are required for solar power concentration, thereby enabling the proposed dynamic PV module to work effectively in solar power concentrations. Furthermore, the dynamicity feature of dynamic PV module helps to accept partial sun light concentration from external static reflector as well as high diffuse light condition at cloudy days.

In another preferred embodiment of the present invention, the dynamic PV module is a glass-to-glass semi-transparent PV module. This may be used as a greenhouse roof, or for any other application such as a carport, canopy or building integrated shaded terraces. The transparency percentage of the PV module is determined based on the spacing and displacement between each two cell stacks. In case of a solar PV greenhouse, the suitable transparency percentage will differ based on the geographical location (light intensity) and plantation types (best growth rate) inside the green house. Another feature of the proposed dynamic PV module is its solar energy-capturing concept, wherein the module enables an approximately complete capturing of the incident solar radiations on a given project area and directs them towards an integrated solar technology with no need for an additional sun tracker. The proposed system functions as a sun light concentrator with no moving parts, which in turn maximizes the energy yield and creates a path for new applications.

This solar energy-capturing concept is a result of integrating the dynamic PV modules with solar reflector sheets such as aluminum composite sheet reflectors. The tilt angles for the PV module and its reflectors are specified as per the site latitude and the preferred time of the year for maximum production. Although this integration may be used as a rooftop or ground mounted project, for double utilization of the site, it is preferred to be used as a building integrated solution (Building integrated photovoltaics or BIPV) considering that this may represent part of a building (like the roof itself). The proposed solar system may also be applied on solar green houses, livestock houses, warehouses, workshops, showrooms, solar car parking areas and countryside houses.

In a preferred embodiment of the present invention, the proposed design comprises a plurality of reflective strips placed in between the PV cell stacks within the PV module that helps in continuously bouncing the incident sunlight from one reflective strip to the next, until absorbed completely by the solar cells. This results in the proposed PV module producing an equal or greater amount of power output, but with a comparatively reduced number of PV cells that lead to a reduction in the overall manufacturing costs of the PV module. These reflective strips are light stimulating or light harvesting reflector strips.

In accordance with the present invention, FIG. 1 illustrates the connection of two main components of the light trapping dynamic PV module in accordance with the present invention, comprising of PV cell 104 and LHS (Light Harvesting) reflective strip 102. Generally, PV cells have a positive terminal (front side) and a negative terminal (back-side) and are connected in series. The negative terminal of the first PV cell 104 is connected with the positive terminal of the next one, and connections are made continuously one after another through wires or ribbons 106 in order that they work in series (for example like cascaded batteries). The LHS 102 is made from conductive material and reflects incident light. The LHS reflective strips 102 are in contact with the ribbons 106 in between cells stacks 104 thereby creating parallel connections between all cells within cell stack 104. This thereby leads to the PV module outputting a dynamic response. Further, the LHS reflective strips 102 are placed in between cell stacks 104 forming a part of the module surface area. These reflective strips 102 also reflect incident sunlight back to the cell stacks 104 through a mirror phenomenon, wherein the incident sun rays are reflected back at an angle of 60° or more from an upper front glass screen of the light trapping dynamic PV module in accordance with the present invention. Accordingly, incident sunlight is trapped within the PV module boundaries. Only a negligible amount of incident solar rays is reflected away from the dynamic photovoltaic module. A top view of the light trapping dynamic PV module in accordance with the present invention is depicted in FIG. 1.

Figure 2:
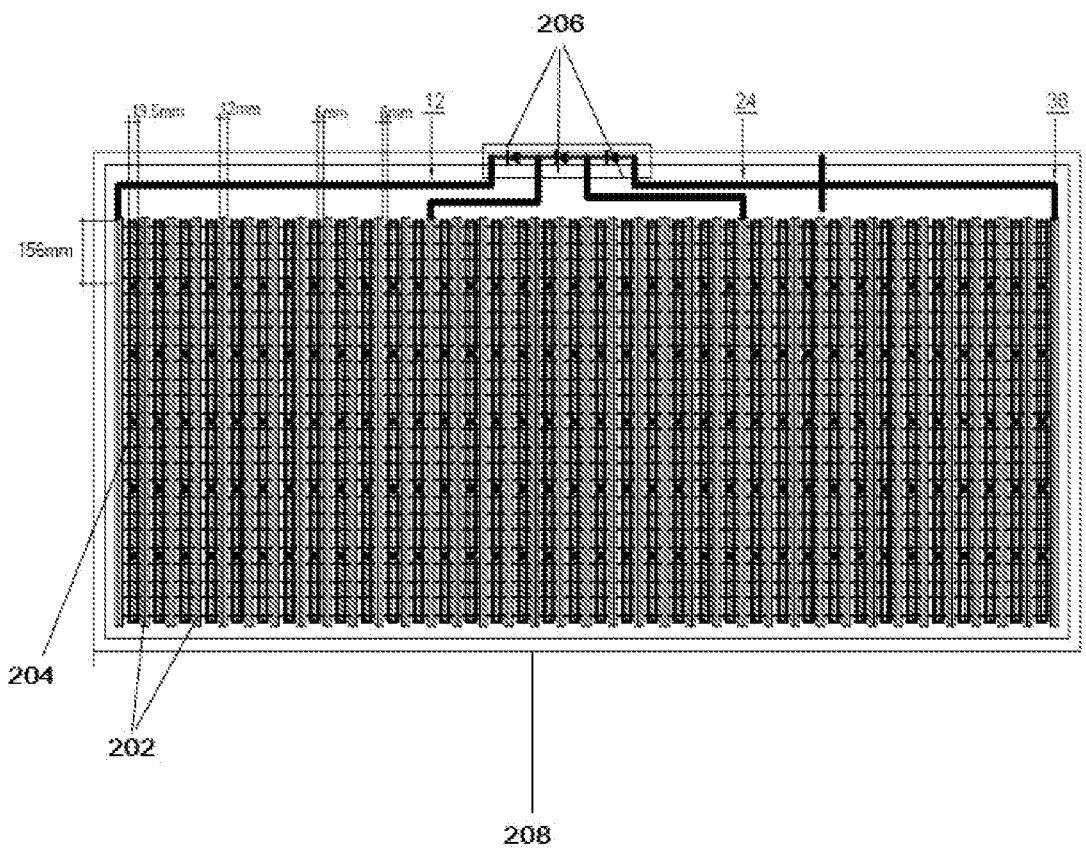
FIG. 2 illustrates a prototype of the photovoltaic (PV) module in accordance with the present invention.

In an embodiment of the present invention, design considerations pertaining to the light trapping dynamic PV module in accordance with the present invention depend on the requirements of a specific project such as type of application, weather conditions at the site, etc. The PV cells are connected continuously one after another through wires or ribbons in order to have the cells function in series. Further, the number of PV cells within a particular module as and when required (in case more power output from the PV module is required). FIG. 2 illustrates a prototype of the PV module 208 in accordance with the present invention. In an embodiment, a first design consideration includes length of a PV sub cell being 156 mm and width of the PV sub cell being 19.5 mm, which is $\frac{1}{8}^{th}$ of an original solar cell. The original cell is laser cut into eight equal strips. Hence, the total number of cells in the cell stack are six, each with dimensions 156 mm×19.5 mm connected in parallel to each other. The expected current from this PV module is ⅝ (0.75=75%) of the original module current, however the current increases depending proportionally on internal light concentration. The reduction in current is intended such that an increase in the module current (due to internal light concentration) suits the rating of other electrical components in the PV module system (bypass diodes, DC cables and inverters).

Another design consideration in accordance with the present invention includes that the width of the LHS reflector strip is 12 mm. This design aids in a majority of the incident sunlight falling on the reflector strips to be reflected back equally on the adjacent PV cells from the upper inner glass surface of the PV module. Regarding efficiency of the reflector strips, this is expected to be approximately 85%. The concentration ratio in this case is calculated as:

(Reflection Efficiency×width of the reflector strips)/(width of the solar cell stack)*100

((0.85*12)/19.5)*100=52%

Hence, overall peak current of the PV module is calculated to be 1.27 times normal module current (0.52+(⅝)). The empty spacing between the PV cells stack and the LHS reflector strips is 6 mm. This design is basically used for a semi-transparent PV module application. In an ordinary PV module, the width of the reflector strips are short. The thickness of the front glass of the solar cell is 6 mm according to presented embodiment of FIG. 2. Selecting the thickness of the front glass of the solar cell is crucial since this thickness ensures that the light rays reflected by the reflector strips have sufficient distance to land on majority of the PV cells. This will result in majority of the incident light rays to be converted to electrical energy, subsequent to being reflected back by the upper surface of the front glass.

As depicted in FIG. 2, there are three bypass diodes 206 connected in a junction box of the PV module or solar cell module. These bypass diodes 206 divide the entire PV module 208 cells into three segments. This electrical arrangement helps to bypass module current surrounding an affected segment of the PV module, in case any one segment of the PV module encounters current mismatch problems owing to shading or obstruction to incident light rays. In the light trapping dynamic PV module 208 of the present invention, a bypass diode 206 becomes active (forward biased) only in extreme shading conditions, which helps to manage the current mismatch problems effectively. However, the light trapping dynamic PV module can manage current mismatch condition by enabling module current to flow without mismatch up to large extent. The bypass diodes 206 are connected to the LHS reflector strip terminals to conduct module current through the bypass diodes 206 in case of extreme shading conditions. The LHS reflector strips 202 enable to divide the number of cell stacks 204 into multiple segments as per the number of bypass diodes 206 connected in the PV module. Therefore a maximum number of bypass diodes in a PV module can be equal to the number of cell stacks within the PV module, however, is practically much lower.

In accordance with a preferable embodiment of the present invention, length and width of the PV module are 1.7 m and 1 m, respectively. The width of PV module must be fixed with respect to the specific design of the light trapping dynamic PV module, however the length may be increased or decreased depending on whether more or less power is required. Most importantly, the design of the PV module starts and ends with the LHS reflector strips, in order to balance the reflected quantity of light on the adjacent PV cells, which may function as start and end bus bars (positive and negative terminals).

Figure 3A:
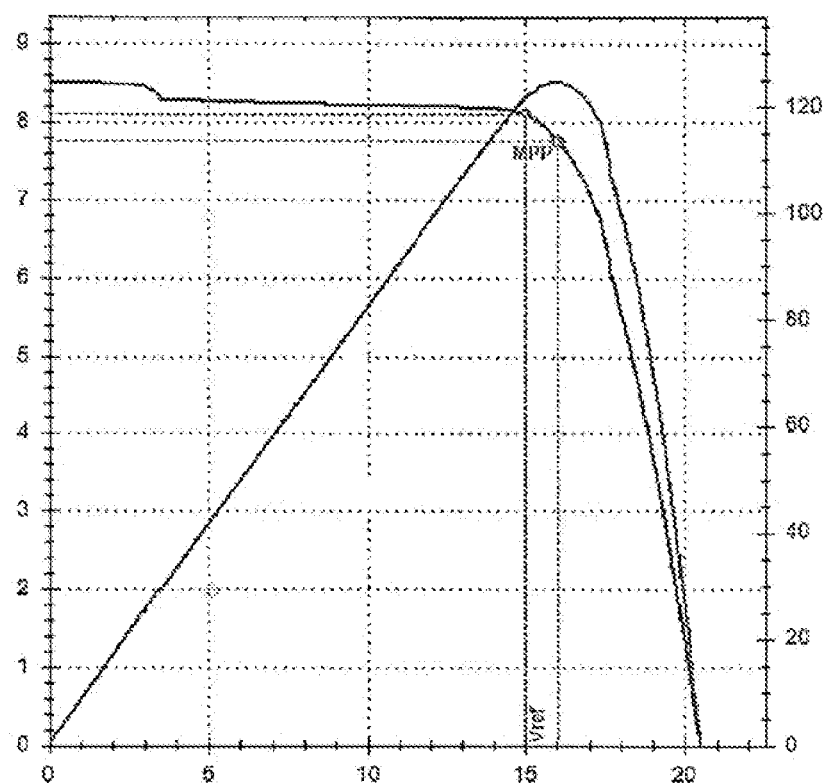
FIG. 3A-J are graphical representations of the dynamic response of the PV module under different shading conditions, in accordance with the present invention.

FIG. 3A-J graphically depict the dynamic response of the PV module under different shading conditions, in accordance with the present invention. The prototype utilized for obtaining the dynamic response is a semi-transparent PV module, which may also be used as a Building integrated PV module (BIPV). The covered part of the module per each test is measured by size of an original solar cell (6 inches×6 inches)=(156 mm×156 mm). The prototype testing was conducted using a Sun stimulator-testing device inside lab of the manufacturing company in Europe. The internal reflection of light from reflective strip to photovoltaic cell has been checked and proved by using red laser light. The maximum power output under different shading conditions were plotted in a Current vs Voltage (I-V) graph. FIG. 3A depicts the dynamic response of the PV module when the full module is completely uncovered. The prototype testing was conducted under a module temperature of 24.3° C. and ambient temperature of 25.3° C., with an irradiance (the flux of radiant energy per unit area, normal to the direction of flow of radiant energy through a medium) of 929 W/m². The maximum power output ($P_{MAX}$) observed for a fully uncovered module was 124.5 W. Various other test results observed were $V_{MP}$=16.0 V, $I_{MP}$=7.76 A, $V_{OC}$=20.5V, $I_{SC}$=8.50 A, $V_{ref}$=15.0V, $I_{Vref}$=8.11 A, $P_{Vref}$=121.6 W, Fill factor=71.4%, $R_{sh}$=26.1Ω, $R_s$=0.351Ω and the PV module efficiency as 7.7%.

Figure 3B:
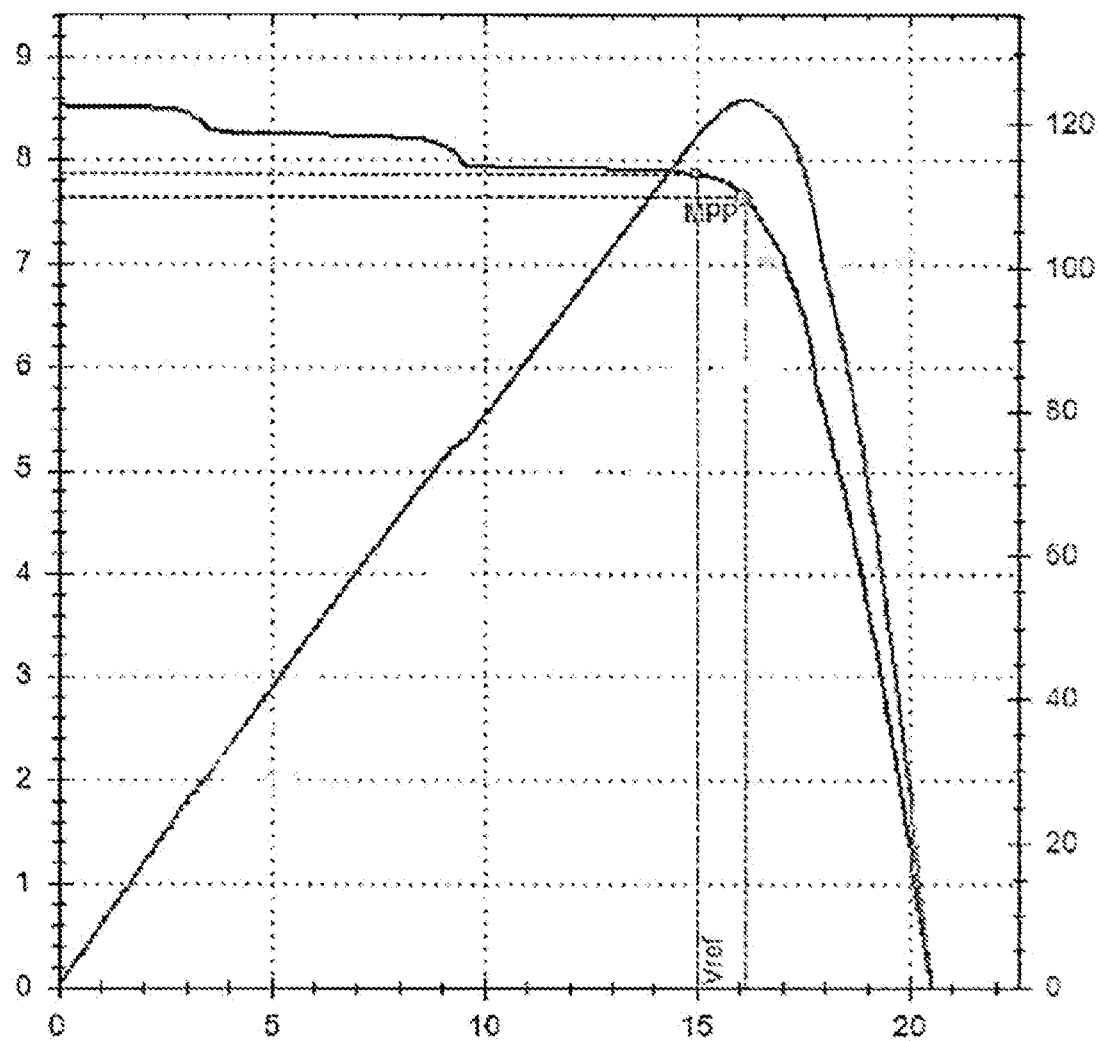
Figure 3C:
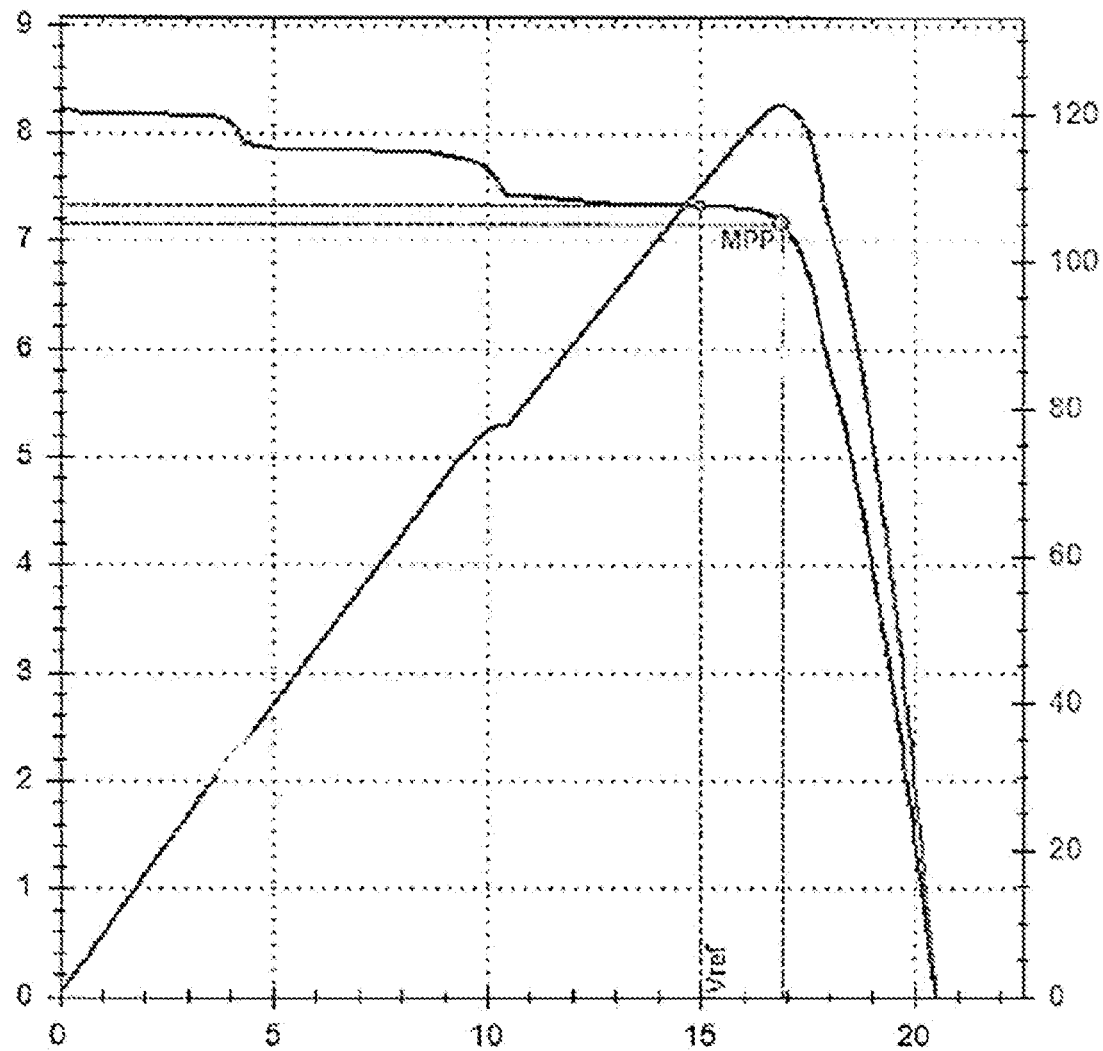

FIG. 3B depicts the dynamic response of the PV module with half of the PV cells covered (6 inches×3 inches). The prototype testing was conducted under a module temperature of 24.7° C. and ambient temperature of 25.3° C. respectively, with an irradiance of 929 W/m². The maximum power output ($P_{MAX}$) observed was 123.1 W. Various other test results observed were $V_{MP}$=16.1 V, $I_{MP}$=7.64 A, $V_{OC}$=20.5V, $I_{SC}$=8.57 A, $V_{ref}$=15.0V, $I_{Vref}$=7.86 A, $P_{Vref}$=118.0 W, Fill factor=70.1%, $R_{sh}$=16.9Ω, $R_s$=0.355Ω and the PV module efficiency as 7.6%. FIG. 3C depicts the dynamic response of the PV module with the PV cell completely covered (6 inches×6 inches). The prototype testing was conducted under a module temperature of 24.9° C. and ambient temperature of 25.4° C. respectively, with an irradiance of 929 W/m². The maximum power output ($P_{MAX}$) observed was 121.0 W. Various other test results observed were $V_{MP}$=16.9 V, $I_{MP}$=7.17 A, $V_{OC}$=20.5V, $I_{SC}$=8.25 A, $V_{ref}$=15.0V, $I_{Vref}$=7.33 A, $P_{Vref}$=110.0 W, Fill factor=71.6%, $R_{sh}$=17.7Ω, $R_s$=0.315Ω and the PV module efficiency as 7.5%.

Figure 3D:
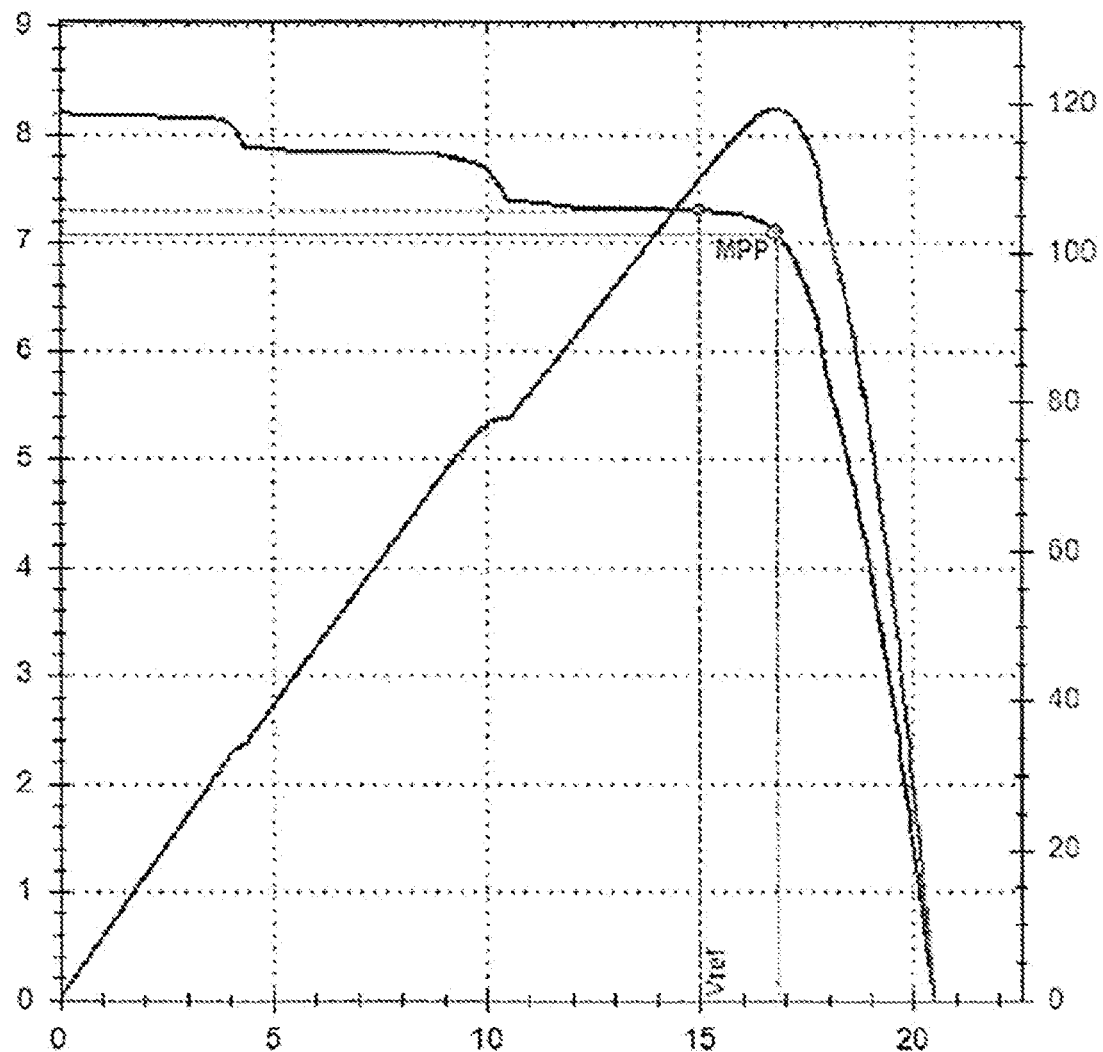
Figure 3E:
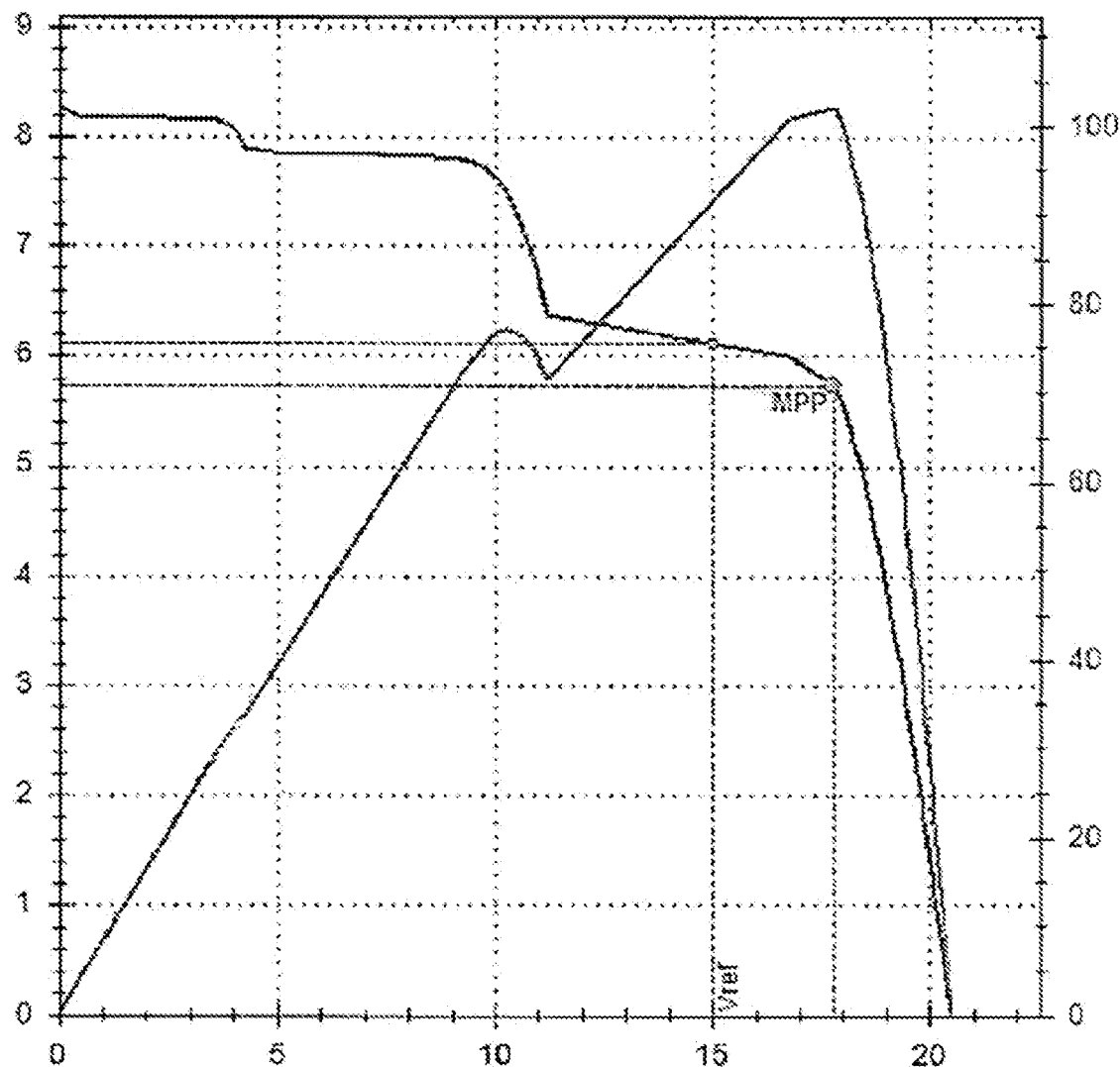

FIG. 3D depicts the dynamic response of the PV module with two PV cells covered (6 inches×12 inches). The prototype testing was conducted under a module temperature of 25.1° C. and ambient temperature of 25.4° C. respectively, with an irradiance of 928 W/m². The maximum power output ($P_{MAX}$) observed was 119.1 W. Various other test results observed were $V_{MP}$=16.8 V, $I_{MP}$=7.09 A, $V_{OC}$=20.5V, $I_{SC}$=8.23 A, $V_{ref}$=15.0V, $I_{Vref}$=7.30 A, $P_{Vref}$=109.5 W, Fill factor=70.7%, $R_{sh}$=21.6Ω, $R_s$=0.317Ω and the PV module efficiency as 7.3%. FIG. 3E also depicts the dynamic response of the PV module with two PV cells covered (12 inches×6 inches) (parallel to the cell stack). The prototype testing was conducted under a module temperature of 25.3° C. and ambient temperature of 25.6° C. respectively, with an irradiance of 928 W/m². The maximum power output ($P_{MAX}$) observed was 102.1 W. Various other test results observed were $V_{MP}$=17.8 V, $I_{MP}$=5.74 A, $V_{OC}$=20.5V, $I_{SC}$=8.27 A, $V_{ref}$=15.0V, $I_{Vref}$=6.12 A, $P_{Vref}$=91.8 W, Fill factor=60.3%, $R_{sh}$=15.3Ω, $R_s$=0.331Ω and the PV module efficiency as 6.3%.

Figure 3F:
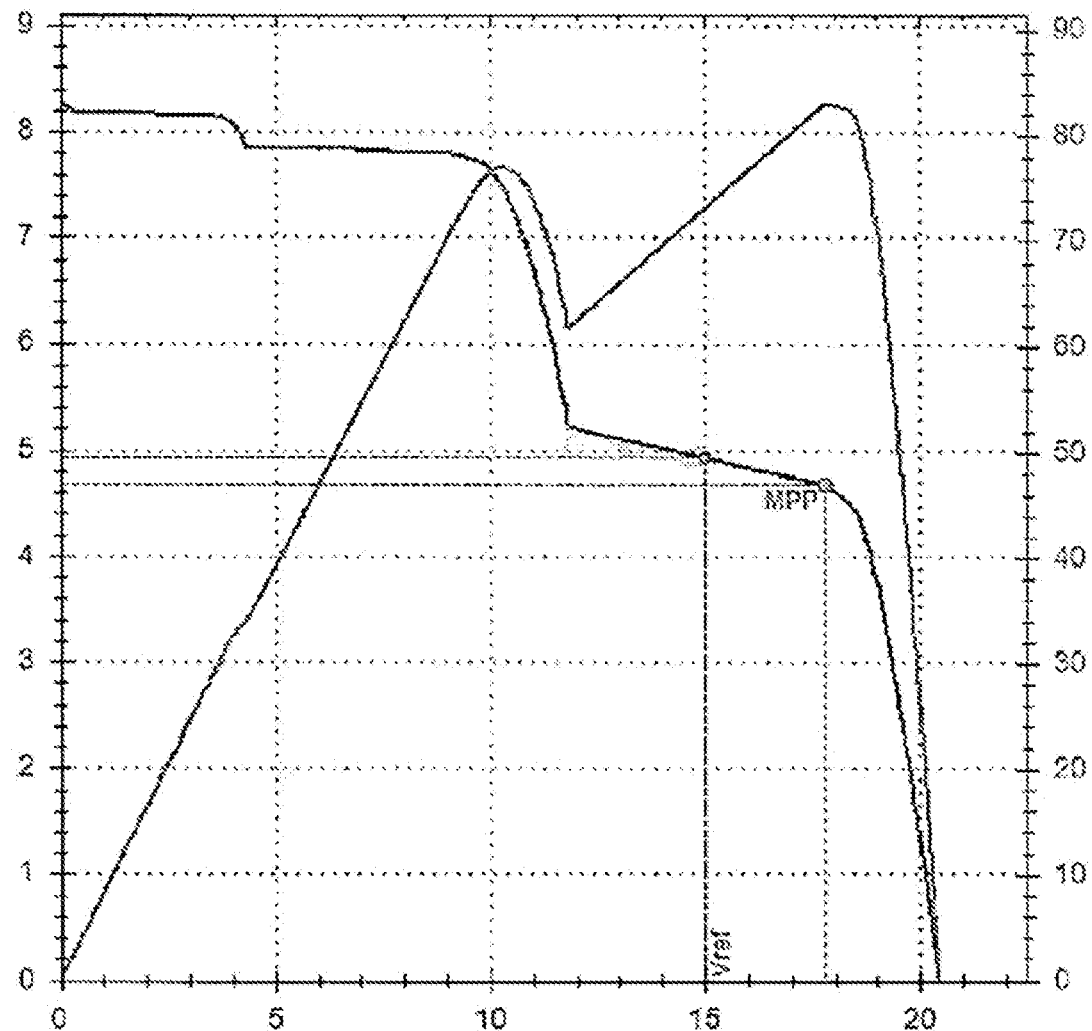
Figure 3G:
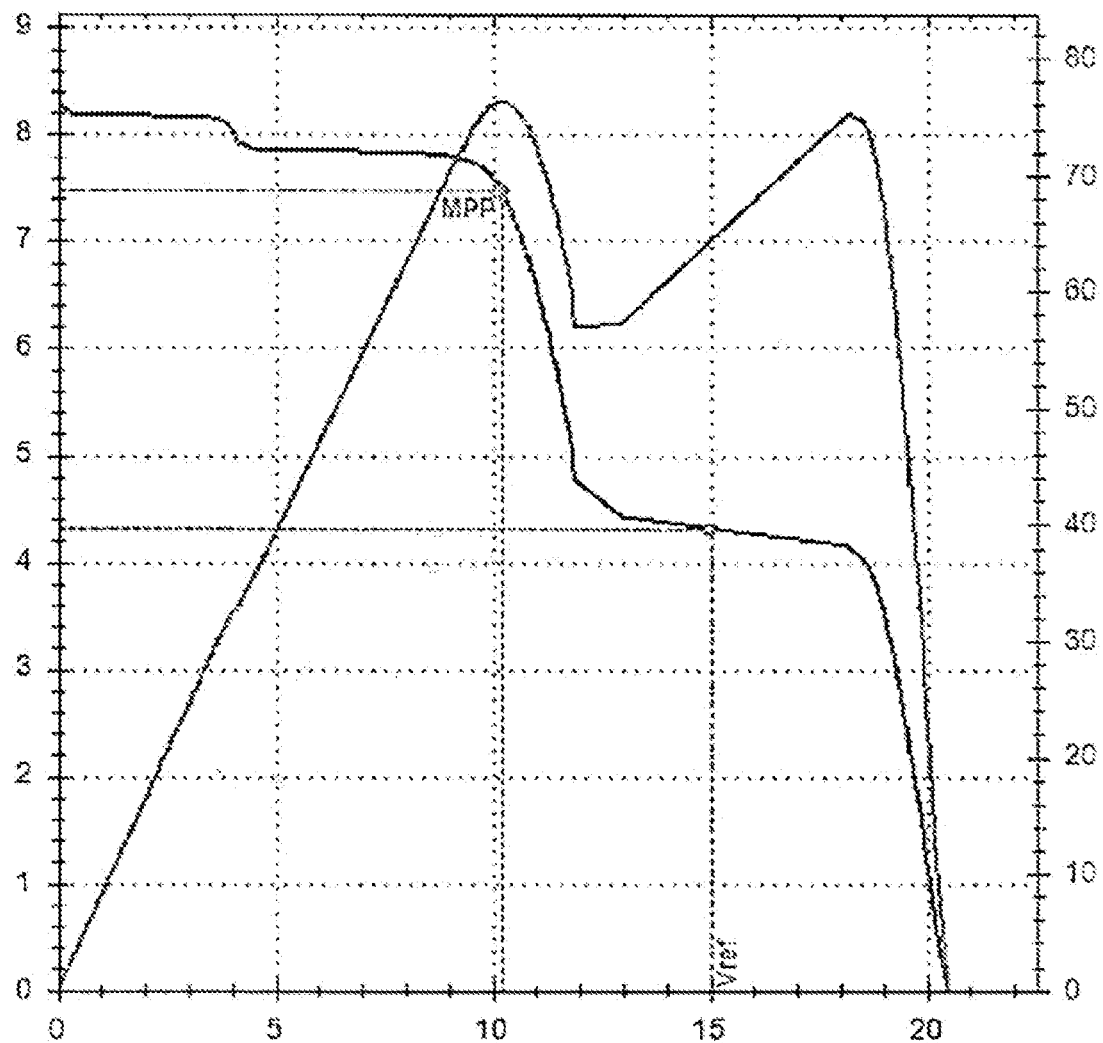

FIG. 3F depicts the dynamic response of the PV module with three PV cells covered (18 inches×6 inches, parallel to the cell stacks). The prototype testing was conducted under a module temperature of 25.2° C. and ambient temperature of 25.5° C. respectively, with an irradiance of 928 W/m². The maximum power output ($P_{MAX}$) observed was 83.2 W. Various other test results observed were $V_{MP}$=17.8 V, $I_{MP}$=4.68 A, $V_{OC}$=20.4V, $I_{SC}$=8.27 A, $V_{ref}$=15.0V, $I_{Vref}$=4.93 A, $P_{Vref}$=74.0 W, Fill factor=49.2%, $R_{sh}$=14.9Ω, $R_s$=0.337Ω and the PV module efficiency as 5.1%. FIG. 3G depicts the dynamic response of the PV module with a heavy shadow covering six PV cells (36 inches×6 inches). The prototype testing was conducted under a module temperature of 25.5° C. and ambient temperature of 25.6° C. respectively, with an irradiance of 928 W/m². The maximum power output ($P_{MAX}$) observed was 76.2 W. Various other test results observed were $V_{MP}$=10.2 V, $I_{MP}$=7.47 A, $V_{OC}$=20.5V, $I_{SC}$=8.30 A, $V_{ref}$=15.0V, $I_{Vref}$=4.31 A, $P_{Vref}$=64.7 W, Fill factor=44.9%, $R_{sh}$=11.4Ω, $R_s$=0.257Ω and the PV module efficiency as 4.7%.

Figure 3H:
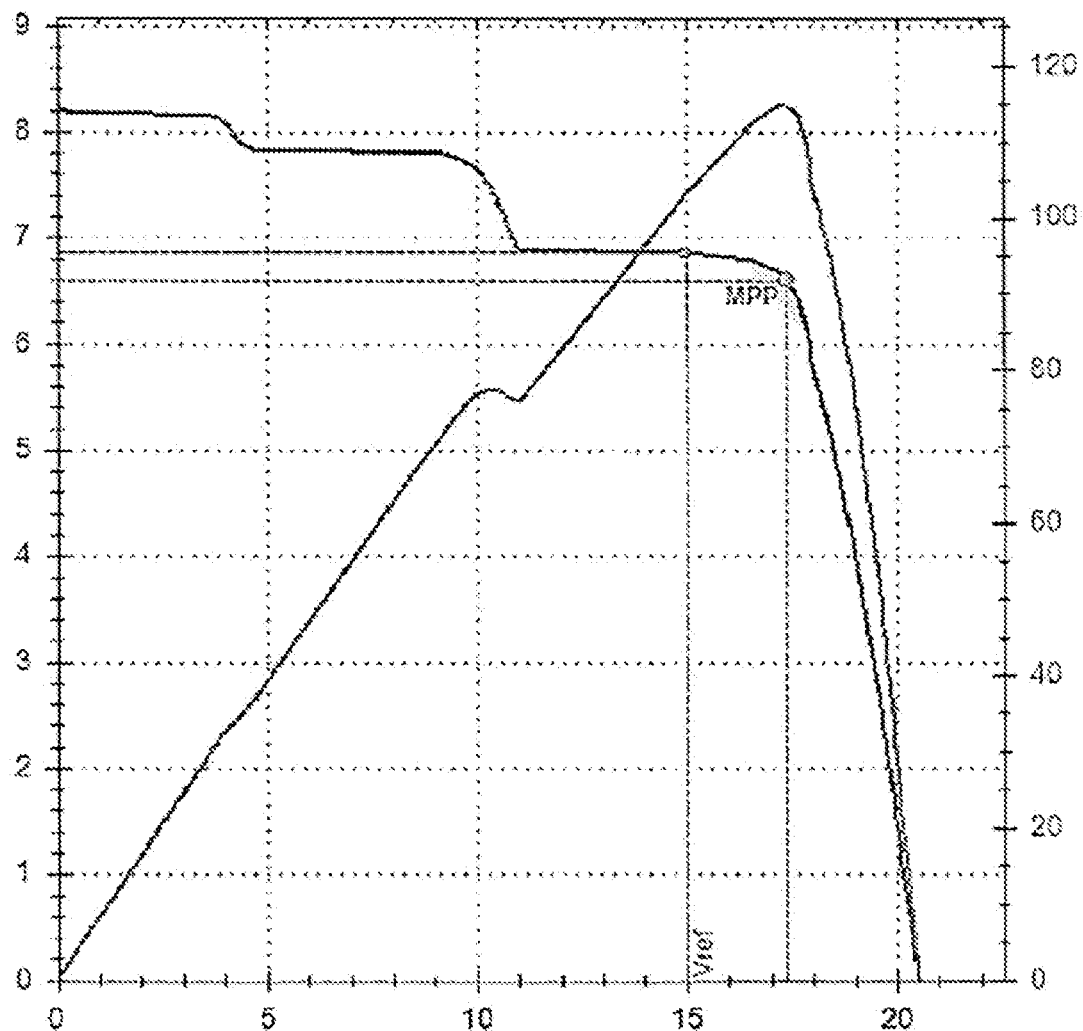
Figure 3I:
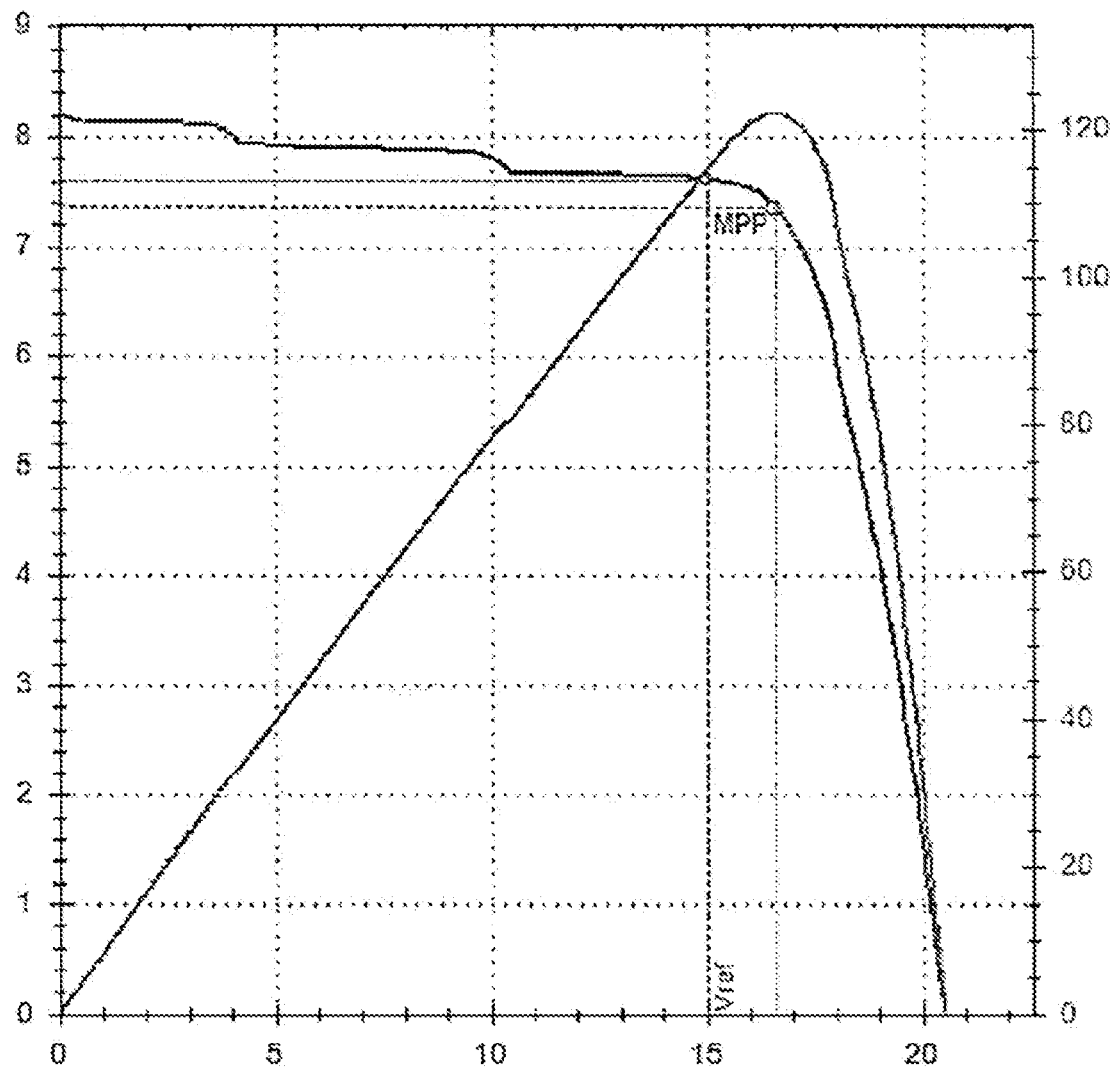

FIG. 3H depicts the dynamic response of the PV module with a low shadow covering six PV cells (36 inches×6 inches). The prototype testing was conducted under a module temperature of 25.4° C. and ambient temperature of 25.6° C. respectively, with an irradiance of 928 W/m². The maximum power output ($P_{MAX}$) observed was 114.7 W. Various other test results observed were $V_{MP}$=17.4 V, $I_{MP}$=6.60 A, $V_{OC}$=20.5V, $I_{SC}$=8.25 A, $V_{ref}$=15.0V, $I_{Vref}$=6.87 A, $P_{Vref}$=103.0 W, Fill factor=67.8%, $R_{sh}$=16.6Ω, $R_s$=0.323Ω and the PV module efficiency as 7.1%. FIG. 3I depicts the dynamic response of the PV module with a low shadow covering ten PV cells (60 inches×6 inches). The prototype testing was conducted under a module temperature of 25.9° C. and ambient temperature of 25.8° C. respectively, with an irradiance of 928 W/m². The maximum power output ($P_{MAX}$) observed was 122.1 W. Various other test results observed were $V_{MP}$=16.6V, $I_{MP}$=7.36 A, $V_{OC}$=20.5V, $I_{SC}$=8.21 A, $V_{ref}$=15.0V, $I_{Vref}$=7.62 A, $P_{Vref}$=114.3 W, Fill factor=72.5%, $R_{sh}$=19.2Ω, $R_s$=0.304Ω and the PV module efficiency as 7.5%.

Figure 3J:
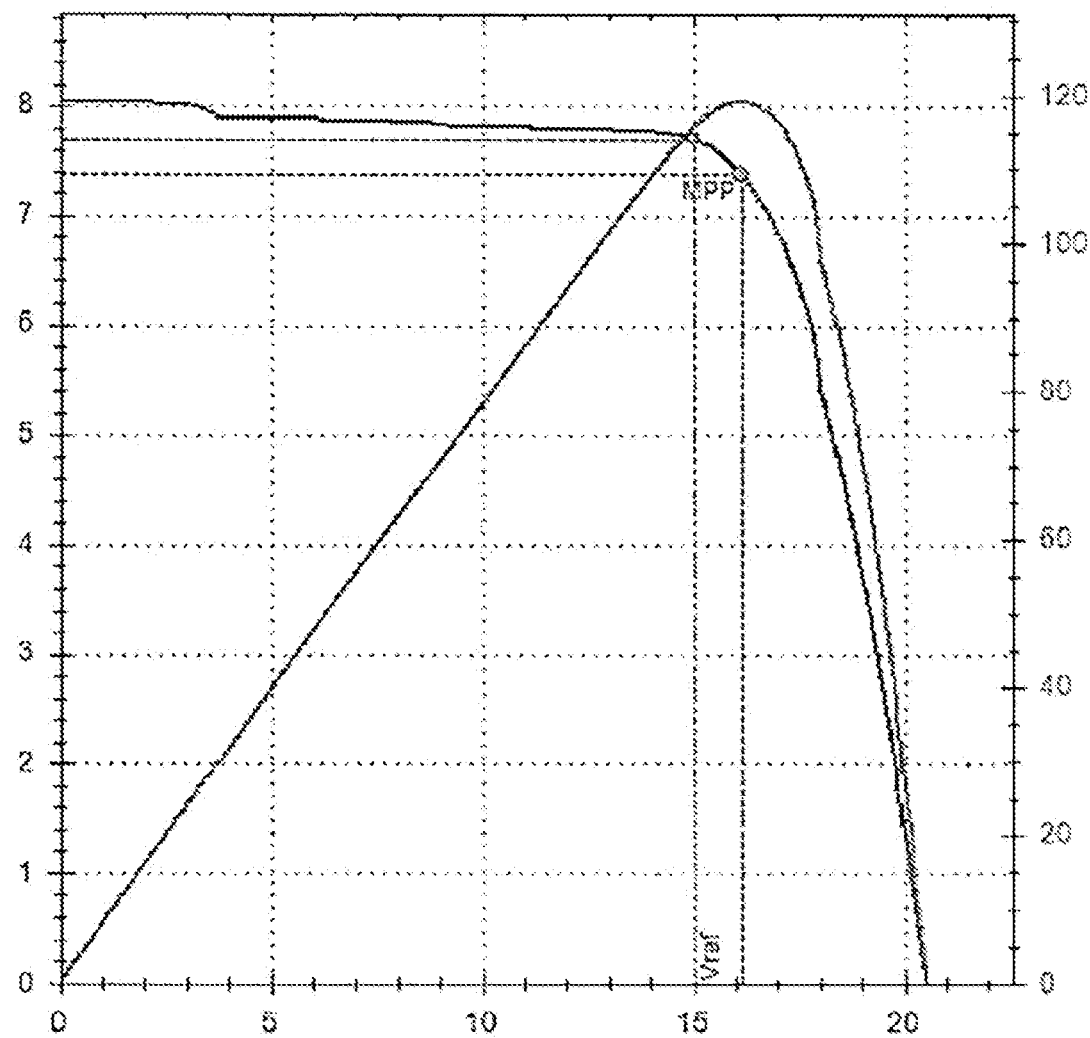

FIG. 3J depicts the dynamic response of the PV module with a low diagonal shadow. The prototype testing was conducted under a module temperature of 26.5° C. and ambient temperature of 26.2° C. respectively, with an irradiance of 923 W/m². The maximum power output ($P_{MAX}$) observed was 119.1 W. Various other test results observed were $V_{MP}$=16.1V, $I_{MP}$=7.38 A, $V_{OC}$=20.5V, $I_{SC}$=8.04 A, $V_{ref}$=15.0V, $I_{Vref}$=7.71 A, $P_{Vref}$=115.6 W, Fill factor=72.2%, $R_{sh}$=46.1Ω, $R_s$=0.355Ω and the PV module efficiency as 7.3%. The above results prove the dynamicity features of the proposed invention.

FIG. 4-7 depict the working of internal light reflection or light trapping within the Light Trapping dynamic PV module in accordance with the present invention. Applying modifications to the thickness of front and back panels and sizing of the reflectors help in using the proposed PV module for a variety of applications. In accordance with the present invention, a plurality of PV cell stack strips are laid in parallel with a plurality of reflector strips or Light Harvesting Strings (LHS) strips. Light Harvesting Strings (LHS) strips are roll clad electrical conductor strips silvered on one side, or both sides for high reflectance of incident solar rays or light rays. The reflector strips in accordance with the present invention are precisely structured with a plurality of grooves along its length for reflecting incident solar rays by 60° to the normal. Solar rays on hitting the surface interface between glass medium and air medium, reflect back with the same incident angle (60° to an adjacent PV cell—which converts the solar rays into electrical energy. The surface interface between glass and air works as a mirror in this case. Therefore, the greatest advantage of using the LHS strips is that its structured surface allows solar rays to be reflected in a precisely defined angle towards the glass-air interface, thereby resulting in total internal reflection (TIR).

This phenomenon further re-directs the reflected solar rays back to the PV cell surface, and thereby enables a reduction in the area of PV cells (or solar cells) being used, by replacing a part of the PV cells with reflector strips that will redirect solar rays to the remaining part of the PV cells. This in turn results in approximately the same power output of a standard PV module comprising completely of PV cells. Hence, the greatest advantage of the present invention is replacement of the more expensive part of the PV module (>50% of material cost) by a relatively cheaper material while improving the PV module performance by enabling dynamic response features within the PV module which all reduces the overall generated energy cost. Another functionality provided by using the LHS strips is that these strips connect all of the sub-cells in parallel within each specific cell stack. Sub-cells are produced by laser cutting standard squared PV cells normal to its bus-bars into equal strips that have the same length of the original cells but widths equal to the quotient of original cell width on the required number of sub-cells. This arrangement enables all the sub-cells to work as a single PV cell strip and thereby create a dynamic response within the PV module. This arrangement enables the PV module to handle abnormal conditions such as soiling, shading and non-uniform sun light concentrations and in some cases the internal solar cells failure due to micro cracks.

In order to attain efficient TIR, all solar rays incident on the reflector strips must be reflected internally back to the surface of the PV cell stack strip area in order to avoid any losses in the PV module output. In order to achieve this, an equation has been developed to manage the relationship between physical dimensions of the proposed PV module components. It is considered the reflector strip width as (A), PV cell strip width as (B), spacing between the strips as (C) and the thickness of the glass being used for the module as (D). Hence, in order to determine the distance (E) in which the ray will travel within the PV module from a point of reflection at the reflector to a point of absorption at the PV cell surface, the following equation is developed—E=2×(D/tan 30°), since the angle of reflected rays to normal is 60°, the remaining angle is 30°.

Accordingly, in order to ensure that the reflected rays fall within the PV cell width the selected solar, PV cell strip width (B) and spacing between the strips (C) must not be less than the calculated distance (E). Also the reflector strip width (A) should not be greater than the PV cell width (B) in case the PV cell is mono facial (front side only). However in case PV cell is bifacial, enabling absorption of solar rays through both the front and back sides, then the reflector strip width (A) may be greater than the PV cell strip width (B). However, the back glass panel must then be provided with appropriate thickness. Further, other electrical parameters of the PV module such as current (I), voltage (V) and power (P) must be adjusted to match the requirements of the connected solar inverter specification.

Figure 4A:
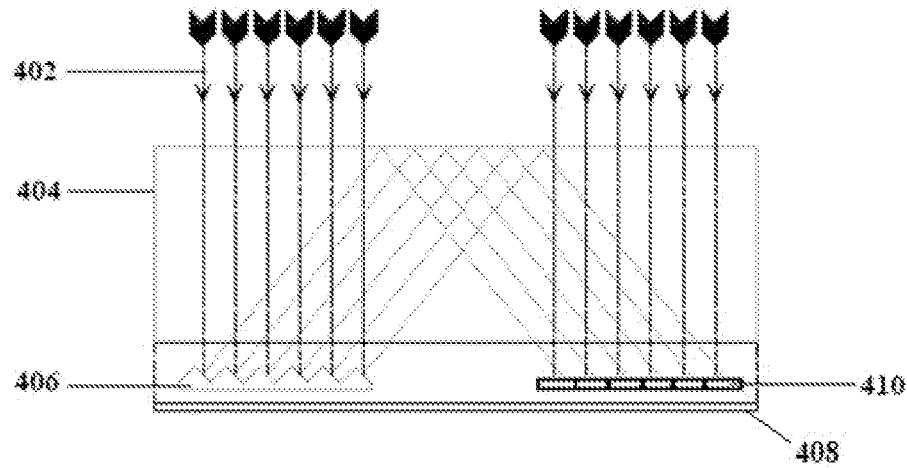
FIG. 4A-D depict a cross sectional schematic view of a Light Trapping Dynamic PV module in accordance with the present invention.
Figure 4B:
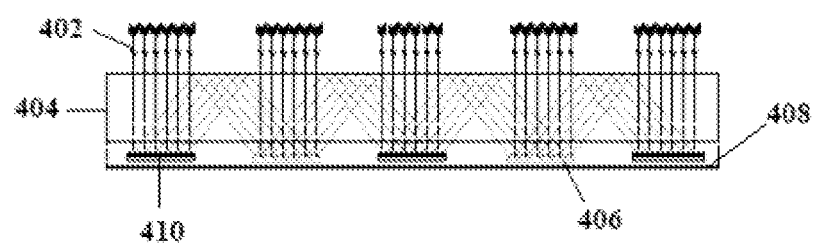
Figure 4C:
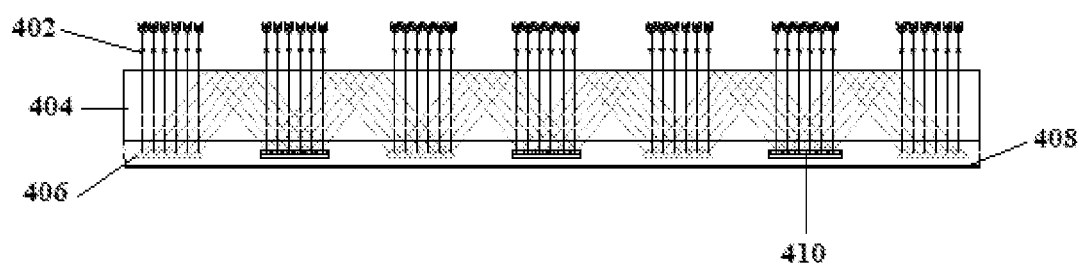
Figure 4D:
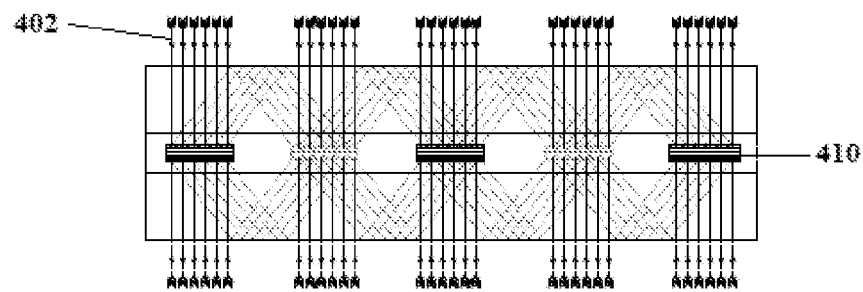

FIG. 4A-D depict a cross sectional schematic view of a Light Trapping Dynamic PV module in accordance with the present invention, wherein the described embodiment includes a front glass panel 404, plastic back sheet 408, solar reflective strips 406 and PV cell stack 410 in addition to encapsulation material and conductive ribbons. FIG. 4A depicts internal reflection of solar rays 402, which are incident on and subsequently reflected from the reflector strips 406 onto the front glass panel or surface 404. These solar rays 402 are then reflected back to an adjacent PV cell stack surface 410 to thereby convert solar energy into electrical energy. FIG. 4B illustrates how two solar reflector strips 406 placed in parallel to the photovoltaic cell stacks 410 further reflect solar rays 402 into the photovoltaic cell stack 410 located in the middle. Accordingly, each solar reflective strip 406 reflects half of the solar rays incident on its surface, equally to either sides, and are thereby collected by the photovoltaic cell stacks 410 located next to them. FIG. 4C denotes placement of adjacent and parallel solar reflective strips 406 and photovoltaic cell stacks 410 within the PV module surface, in order to deploy the invention principle and result in a constant solar concentration ratio on all PV elements of the module. The solar reflector strips 406 and PV cell stacks 410 are placed in sequence starting and ending with a solar reflector strip 406. FIG. 4D depicts internal reflection of solar rays when the proposed PV module is equipped with bifacial PV cells and transparent back glass panel. Accordingly, the reflection phenomenon is applicable at the backside of the PV module as well, due to the reflected sunlight from ground for example.

Figure 5A:
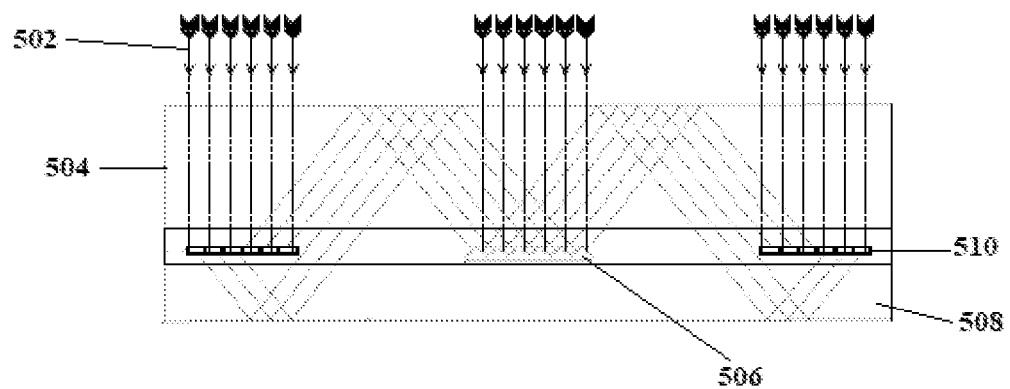
FIG. 5A-C light reflection between the front and back glass panels of the Light Trapping Dynamic PV Module in accordance with the present invention.
Figure 5B:
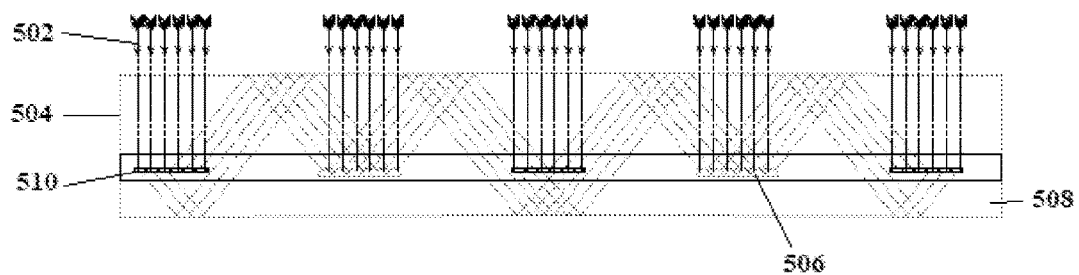
Figure 5C:
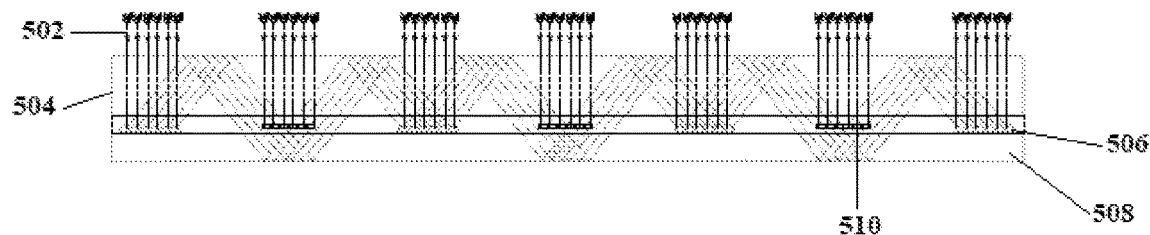

FIG. 5A-C light reflection between the front and back glass panels of the Light Trapping Dynamic PV Module in accordance with the present invention. The cross-sectional views show the front glass panel 504, back glass panel 508, solar reflective strips 506 and bifacial PV cell stacks 510 for capturing and reflecting solar rays using both front and back panels on the proposed PV module. This embodiment results in increasing the solar concentration ratio by two times by increasing reflector area, reducing the PV element area and by adjusting thicknesses of the front and back glass panels. This design may be implemented in semi-transparent PV module applications such as greenhouses. FIG. 5A illustrates internal reflection of solar rays 502 from the reflector strip 506 to the front glass surface 504 and subsequently to the PV cell stack surface 510 as well as to the back glass panel 508, and then to be reflected again to the back side of the PV cell stack 510. The same concept is applicable in case solar rays 602 through reflection on the ground are received at the backside of the PV module. FIG. 5B depicts how two reflector strips 506 placed parallel to the PV cell stacks 510 reflect solar rays to both the front and back sides of the bifacial PV cell 510 located in the middle. Each reflector strip 506 reflects half of the incident solar light to both left and right sides equally to be collected by front and backsides of PV bifacial elements. FIG. 5C denotes placement of adjacent and parallel solar reflective strips 506 and PV cell stacks 510 within the PV module surface, in order to deploy the invention principle and result in a constant solar concentration ratio on all PV elements of the module. The solar reflector strips 506 and photovoltaic cell stacks 510 are placed in sequence starting and ending with a solar reflector strip 506.

Figure 6A:
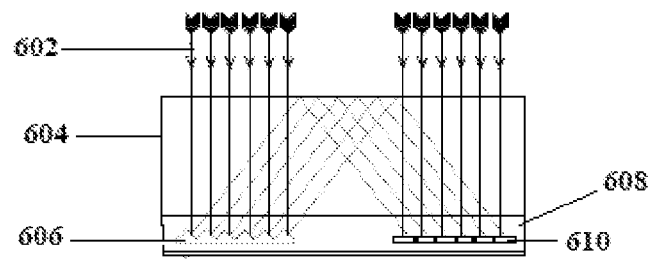
FIG. 6A-D depict a cross sectional schematic view of the Light Trapping Dynamic PV module with the principle of internal light trapping or concentration.
Figure 6B:
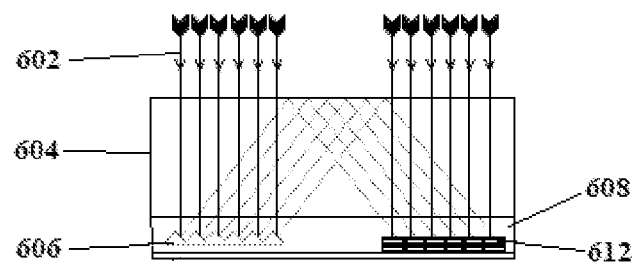
Figure 6C:
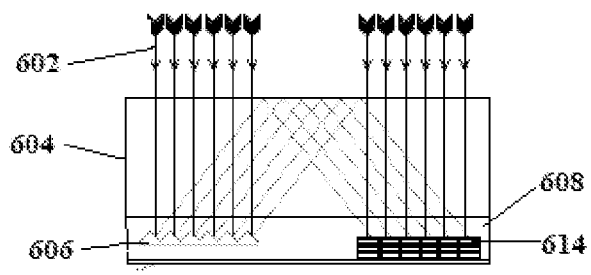
Figure 6D:
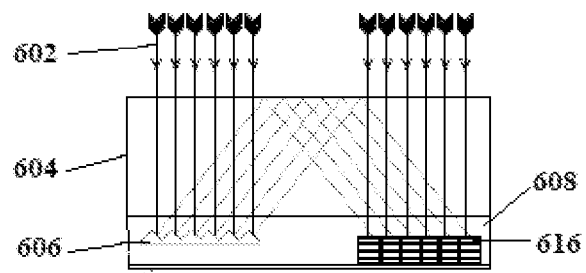

FIG. 6A-D depict a cross sectional schematic view of the Light Trapping Dynamic PV module with the principle of internal light trapping or concentration. This embodiment describes a front glass panel 604, plastic back sheet 608, reflective strips 606 and PV cell stacks 610, in addition to encapsulation material and ribbons. FIG. 6A illustrates the internal reflection of incident solar rays 602 from the reflector strip 606 onto the upper glass panel or surface 604 and then back to the PV cell stack surface 610 for being converted into electrical energy. A single junction PV cell is used in this embodiment. FIG. 6B depicts internal reflection of solar rays 602 from the reflector strips 606 onto the upper glass surface 604 and subsequently back to the PV cell stack surface 610. The PV cell type being used in this embodiment is a hybrid tandem cell 612, which comprises any two single junction PV cells, either stacked in series and having two terminals, or each cell being stacked may each possess two terminals individually. FIG. 6C depicts internal reflection of solar rays 602 from the reflector strip 606 onto the front glass panel or surface 604 then back to the PV cell stack surface 610, wherein the PV cells being used are tandem cells 614 comprising any three single junction PV cells, either stacked in series and having two terminals, or each cell being stacked may each possess two terminals individually. FIG. 6D illustrates internal reflection of solar rays 602 from the reflector strips 606 onto the front glass panel or surface 604 and then back to the PV cell stack 610 surface, wherein the PV cells being used are tandem cells 616 comprising a plurality of single junction PV cells, either stacked in series and having two terminals, or each cell being stacked may each possess two terminals individually.

In another embodiment, the used solar photovoltaic cells are made of single, hybrid or tandem cells comprising a plurality of single junction PV cells, either stacked in series and having two terminals, or each cell being stacked may each possess two terminals individually.

Figure 7A:
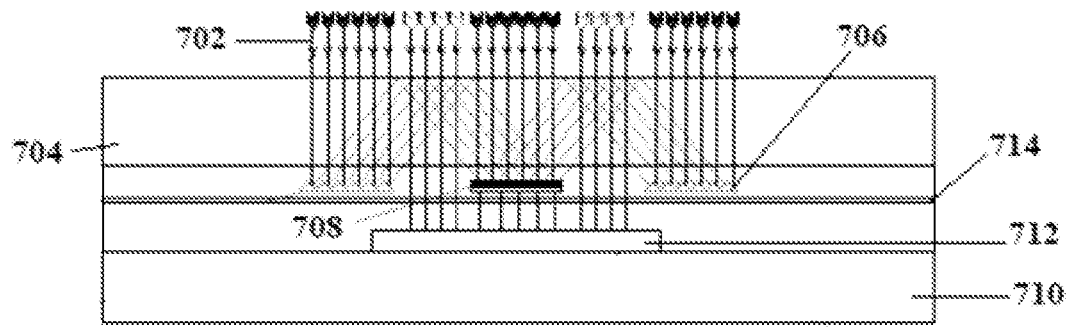
FIG. 7A-C depict front and back light reflection between front and back glass panels of the light trapping dynamic PV module in accordance with the present invention.
Figure 7B:
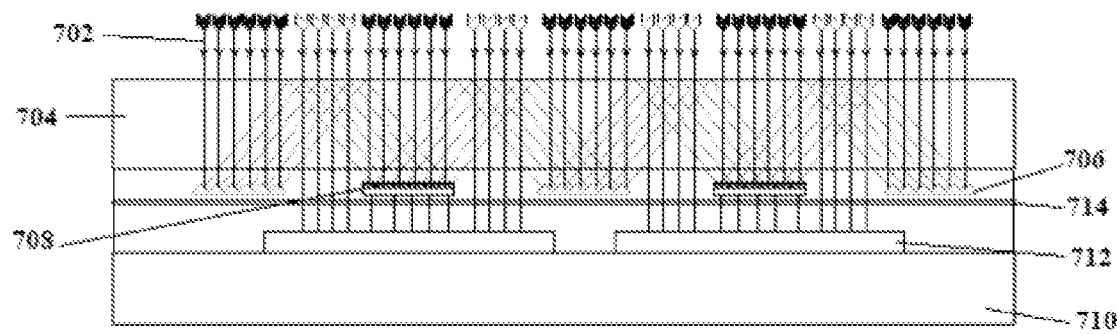
Figure 7C:
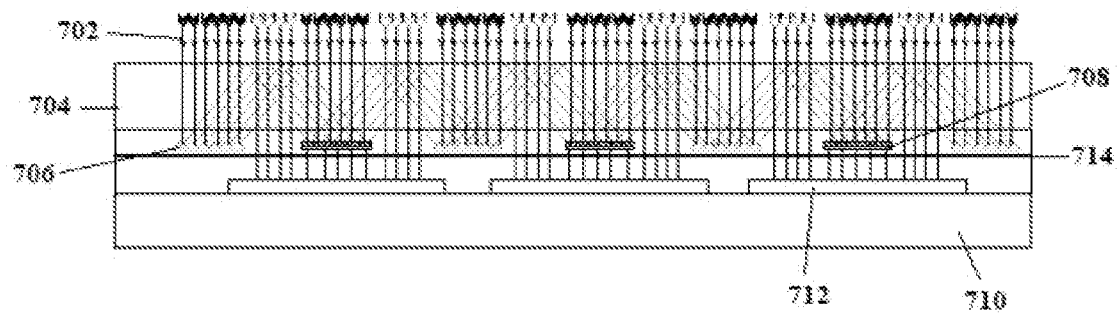

FIG. 7A-C depict front and back light reflection between front and back glass panels of the light trapping dynamic PV module in accordance with the present invention. This embodiment describes a front glass panel 704, reflective strips 706 and bifacial PV cell stacks 708 used in order to capture solar rays 702 using both the front and backsides of the PV module. A thin film PV layer 712 is deposited on an inner side of the back glass panel 710 in order to capture solar rays, and a transparent electrical insulation material 714 is placed between the front glass panel 704 and the back glass panel 710. Each PV cell being used possess its own electrical terminals. The thin film PV layer 712 is placed below the semi-transparent (bifacial) PV cells in order to capture any solar rays which may have not been absorbed by these semi-transparent (bifacial) PV cells, thereby maximizing overall conversion efficiency of the PV module. Conversion efficiency of a photovoltaic module is defined as the capacity for converting a percentage of incident solar rays into electricity. This thin film PV layer 712 is wider in dimensions than the upper PV cells, and begins from the end of one reflector strip 706 to the beginning of the next reflector strip—for capturing any solar rays 702 which may have been left uncaptured. This design is more economical and may be used in applications requiring high efficiency energy conversions, with smaller area size. Furthermore, a thin photovoltaic technology deposited on flexible substrate can be used in this embodiment instead of thin film technology deposited on glass panel 710. May be further development might result in full flexible Light Trapping Dynamic PV module.

In another embodiment, the back glass panel surface is coated by a reflected material or added a corrugated reflector sheet.

In another embodiment the light trapping dynamic module is deployed for car roof tops PV power.

In another embodiment the light trapping dynamic PV module is integrated with solar thermal collector plate for full capturing of solar energy.

In another embodiment, the proposed PV module employing a plurality of reflective strips acts as a low concentrator PV system, wherein the sun concentration may be amplified up to three times, or five times the actual concentration in case additional external reflectors are employed. The light trapping dynamic PV module in accordance with the present invention performs better than conventional PV modules owing to the dynamicity feature, and will have relatively lesser costs. The surface of the proposed PV module comprises a combination of PV cells and reflective strips in a certain arrangement and shape. The plurality of PV cells convert sunlight received directly from the sun, and light which is reflected back between the plurality of reflective strips and glass into electric energy. The functionalities of the LHS strips in accordance with the present invention include creation of TIR of incident solar rays on both front and back glass panels of the PV module, enabling formation of a single long PV cell strip for creating a dynamic response for the PV module. Further, the LHS strips enable outward heat dissipation from the PV cells, reduces the overall costs of the PV module, increases efficiency of the PV module and provides an overall athletic or appealing appearance to the PV module, owing to the silver coating (for high reflectance property).

Generation current of a PV cell is a function of the number of photons (N) hitting the PV surface area. Therefore, current of a PV cell is directly proportional to the degree of concentration of sun light. The following relation formula describes the obtained increase in PV cell current owing to an increase in the concentration of light—$I_{sc}$ (concentrated light)=$C_{opt}$ $I_{SC}$(incident light, 1 Sun) wherein $I_{sc}$ is short circuit current of a PV cell and $C_{opt}$ is the optical concentration ratio. In addition there is a logarithmic dependence between the cell open circuit voltage and the light concentration ratio which also results in a slight improvement in the solar cell efficiency. But since concentration of light increases cell temperature and in turn the series resistance of a PV cell, this creates internal power losses. Therefore, since the percentage increase in cell efficiency is not constant over the range of light concentration, it has been found that concentrating light at much greater than ×17 ratio becomes unfeasible because of excessive losses. However, the present invention works with a lower light concentration ratio (lower than ×17) and therefore falls within an economically feasible light concentration margin.

The proposed PV module also possesses a design for maintaining a percentage improvement of cell efficiency owing to light concentration stability over a possible range of light concentration. This is achieved by reducing series resistance of the PV cells and through having incorporated heat dissipation material. Initially, within the proposed PV module design, the original PV cell is laser cut into smaller equal PV strips thereby dividing the series resistance in accordance with the number of cut cell strips. Further, considering that the reflector strips being employed are also metallic strips, these strips carry electric current between the PV cells in case of an abnormal condition and also carry heat energy from the PV cells and outwardly dissipate this heat in order to maintain the PV cells temperature—while continuing to perform the function of solar ray reflection. As the concentration level of incident light increases, the PV cell strip width is decreased, thereby resulting in a lower series resistance and lower internal power loss and heat loss (as well as relatively larger reflector strip widths for higher concentrations, which results in better heat dissipation).

The proposed PV module can work with external static solar reflector plate as an integrated sun light concentration system which does not use any moving parts or sun trackers, and thereby requires minimal structure maintenance. In addition, considering that the calculated percentage improvement in cell efficiency for one extra sun concentration is 3.27%, the estimated total achievable percentage increase in efficiency (within the concentration range of this invention) is 15%. This increase in efficiency compensates with internal optical losses owing to the light concentration material being used.

In another embodiment of the present invention, a method of manufacturing the light trapping PV module is disclosed. In another embodiment, the proposed PV module is employed both as a normal PV module and as Building integrated photovoltaic (BIPV).

Many changes, modifications, variations, photovoltaic technologies integration and other uses and applications of the subject invention will become apparent to those skilled in the art after considering this specification and the accompanying drawings, which disclose the preferred embodiments thereof. All such changes, modifications, variations and other uses and applications, which do not depart from the spirit and scope of the invention, are deemed to be covered by the invention, which is to be limited only by the claims which follow.

The invention claimed is:

1. A light trapping dynamic photovoltaic module having a module surface configured to be exposed to solar rays, comprising:
   a plurality of photovoltaic cell stacks configured adjacent to each other throughout the module surface, wherein each photovoltaic cell stack among said plurality of photovoltaic cell stacks comprises a plurality of photovoltaic cells cell strips, wherein each photovoltaic cell strip among said plurality of photovoltaic cell strips is arranged vertically and connected in parallel to each other; and
   a plurality of reflective strips placed in between each of the photovoltaic cell stacks for continuously reflecting incident solar rays from one reflective strip to another until absorbed by a photovoltaic cell strip among said plurality of photovoltaic cells cell strips,
   wherein the plurality of reflective strips are silvered on a first side or both front and back sides for enhanced reflectance, the reflective strips forming a part of the module surface area, wherein the incident solar rays are continuously reflected through a mirror phenomenon, wherein the incident solar rays are additionally reflected by a front panel and a back panel of the dynamic photovoltaic module—the plurality of photovoltaic cell stacks being encapsulated within the front panel and the back panel, thereby trapping incident solar rays within boundaries of the dynamic photovoltaic module for conversion into electrical energy, wherein there is a transparent electrical insulation material between the front panel and the back panel, and wherein a thin film photovoltaic layer is deposited on an inner side of the back panel, the thin film photovoltaic layer being wider in dimensions than that of the photovoltaic cell strips for capturing unabsorbed solar rays;
   and wherein the light trapping dynamic photovoltaic module functions as a solar concentrator without external moving parts.

2. The light trapping dynamic photovoltaic module of claim 1, wherein the plurality of reflective strips are light stimulating or light harvesting reflective electrical conductor strips, and wherein the plurality of reflective strips and the plurality of photovoltaic cell stacks are placed in a sequence starting and ending with a reflector strip, resulting in a constant solar concentration ratio on all elements of the dynamic photovoltaic module, and wherein the concentration ratio is calculated by the formula:

((Reflection Efficiency*Width of the Reflector Strips)/Width of Photovoltaic Cell Stack)*100.

3. The light trapping dynamic photovoltaic module of claim 1, wherein the light harvesting reflective strips are made of a conductive material, and carry electric current between the plurality of photovoltaic cells cell strips as well as heat energy from the plurality of photovoltaic cells cell strips, and outwardly dissipate the heat energy, thereby maintaining a temperature of the light trapping dynamic photovoltaic module while performing continuous reflection of the incident solar rays.

4. The light trapping dynamic photovoltaic module of claim 1, wherein the plurality of reflective strips are in contact with ribbons or bus-bars located in between each of the photovoltaic cell stacks, thereby creating parallel connections between the plurality of photovoltaic cells cell strips within each of the plurality of photovoltaic cell stacks, for achieving a dynamic response under varying shading conditions, for allowing current to flow without current mismatch and without aid of a smart device, wherein the reflective strips are placed in between the photovoltaic cell stacks such that there is a space between each reflective strip and each photovoltaic cell stack, wherein the width of the photovoltaic cell strip and the length of the space between each reflective strip and each photovoltaic cell stacks is equal to or greater than a distance travelled by the incident solar rays, wherein the distance travelled by the incident solar rays is calculated by the formula:

(2*(the thickness of the glass encapsulating the photovoltaic cell stack/tan 30)), the reflector strip width being lesser than the photovoltaic cell strip width.

5. The light trapping dynamic photovoltaic module of claim 1, wherein the plurality of photovoltaic cell stacks are connected in series to each other.

6. The light trapping dynamic photovoltaic module of claim 1, wherein the plurality of reflective strips are structured with a plurality of grooves along its width for reflecting the incident solar rays at an angle enabling total internal reflection (TIR) of the incident solar rays on both the front and back glass panels of the light trapping dynamic photovoltaic module.

7. The light trapping dynamic photovoltaic module of claim 1, wherein the plurality of photovoltaic cell stacks are encapsulated in between the front panel and the back panels of the dynamic photovoltaic module.

8. The light trapping dynamic photovoltaic module of claim 7, wherein the front panel is made of glass.

9. The light trapping dynamic photovoltaic module of claim 7, wherein the back panel is made of glass, a multilayer laminate film or an ethylene vinyl acetate (EVA) film or is made of a corrugated reflector sheet.

10. The light trapping dynamic photovoltaic module of claim 7, wherein the incident solar rays are reflected at an angle of 60° from the front panel of the light trapping dynamic photovoltaic module.

11. The light trapping dynamic photovoltaic module of claim 1, wherein bypass diodes are connected in parallel to the plurality of photovoltaic cell stacks for protection and dynamicity of the light trapping dynamic photovoltaic module.

12. The light trapping dynamic photovoltaic module of claim 1, wherein a junction box is connected to the terminals of the dynamic photovoltaic module, the junction box comprising a plurality of main bypass diodes, wherein the plurality of main bypass diodes are installed inside the junction box, wherein the plurality of main bypass diodes divide the dynamic photovoltaic module into a plurality of segments, wherein the plurality of main bypass diodes are connected to the reflective strip terminals, wherein the plurality of main bypass diodes are connected in parallel to the photovoltaic cell stack and become active (forward biased) in extreme shading conditions to manage current mismatch problems; and a plurality of additional bypass diodes, wherein the plurality of additional bypass diodes is greater in number than the plurality of main bypass diodes, and wherein the plurality of additional bypass diodes is in parallel to the plurality of main bypass diodes to provide redundant protection.

13. The light trapping dynamic photovoltaic module of claim 1, wherein the dynamic photovoltaic module is integrated with solar reflector sheets such as aluminium composite sheet reflectors, to function as an external static solar reflector plate as an integrated solar concentration system which does not use moving parts or sun trackers.

* * * * *